United States Patent
Liao

(10) Patent No.: US 12,463,640 B2
(45) Date of Patent: Nov. 4, 2025

(54) SINGLE-FET MUX SWITCH FOR COIL SELECTION

(71) Applicant: AyDeeKay LLC, Aliso Viejo, CA (US)

(72) Inventor: Yong Liao, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 874 days.

(21) Appl. No.: 17/712,028

(22) Filed: Apr. 1, 2022

(65) Prior Publication Data

US 2023/0139164 A1    May 4, 2023

Related U.S. Application Data

(60) Provisional application No. 63/275,452, filed on Nov. 4, 2021.

(51) Int. Cl.

| | |
|---|---|
| *H02J 50/40* | (2016.01) |
| *H02J 50/12* | (2016.01) |
| *H02J 50/80* | (2016.01) |
| *H03K 17/567* | (2006.01) |
| *H03K 17/687* | (2006.01) |
| *H03K 17/693* | (2006.01) |

(52) U.S. Cl.
CPC ........... *H03K 17/693* (2013.01); *H02J 50/12* (2016.02); *H02J 50/40* (2016.02); *H02J 50/80* (2016.02); *H03K 17/567* (2013.01); *H03K 17/6871* (2013.01)

(58) Field of Classification Search
USPC .................. 320/106, 107, 108, 109, 110
See application file for complete search history.

(56) References Cited

U.S. PATENT DOCUMENTS

| | | | |
|---|---|---|---|
| 10,432,025 B2 | 10/2019 | Mirbozorgi et al. | |
| 10,498,163 B2 | 12/2019 | Lee | |
| 10,840,741 B2 | 11/2020 | Smith et al. | |
| 2013/0119928 A1 | 5/2013 | Partovi | |
| 2016/0308397 A1 | 10/2016 | Jung et al. | |

(Continued)

FOREIGN PATENT DOCUMENTS

KR    2020077082 A  *  6/2020  .............. H02J 50/10

OTHER PUBLICATIONS

PCT Patent Appl. Serial No. PCT/US22/046342, International Search Report and Written Opinion, Jan. 6, 2023.

*Primary Examiner* — Brian Ngo
(74) *Attorney, Agent, or Firm* — Steven Stupp

(57) ABSTRACT

An integrated circuit is described. This integrated circuit may include a wireless-charger transmitter, which includes a driver circuit electrically coupled to multiple branches associated with multiple transmission coils. A given branch may include or may be electrically coupled to: a capacitor, a multiplexor (MUX) switch that includes a single field-effect transistor (FET) or a single integrated-gate bipolar transistor (IGBT), and a given transmission coil. Moreover, the wireless-charger transmitter may include a control circuit that provides control signals to gates of FETs or the IGBTs in the branches that selectively activate at least the MUX switch in the given branch and selectively deactivate remaining MUX switches in a remainder of the branches. Furthermore, the driver circuit may perform wireless charging by driving the given transmission coil in the activated given branch using an electrical signal having a fundamental frequency component.

20 Claims, 8 Drawing Sheets

(56) References Cited

U.S. PATENT DOCUMENTS

| | | |
|---|---|---|
| 2018/0269725 A1 | 9/2018 | Yeo et al. |
| 2018/0301933 A1 | 10/2018 | Lee et al. |
| 2018/0301936 A1 | 10/2018 | Lee et al. |
| 2019/0097448 A1* | 3/2019 | Partovi .................. B60L 53/12 |
| 2020/0106304 A1 | 4/2020 | Maniktala |
| 2020/0366121 A1 | 11/2020 | Guedon |
| 2021/0028653 A1 | 1/2021 | Park et al. |
| 2021/0143688 A1* | 5/2021 | Agrawal .................. H02H 3/08 |

* cited by examiner

SINGLE-FET MUX SWITCH FOR COIL SELECTION

CROSS REFERENCE TO RELATED APPLICATIONS

This application claims priority under 35 U.S.C. 119(e) to U.S. Provisional Application Ser. No. 63/275,452, entitled "Single-FET Mux Switch for Coil Selection," by Yong Liao, filed on Nov. 4, 2021, the contents of both of which are herein incorporated by reference.

FIELD

The present disclosure relates to techniques for wireless charging using a wireless-charger transmitter.

BACKGROUND

In order to cover a large area, a wireless-charger transmitter may include multiple transmission coils. In some wireless-charger transmitters, the transmission coils each function as one half of a transformer, which is sometimes referred to as a 'half-bridge driver.' However, when an electronic device (such as a cellular telephone) is placed on the wireless-charger transmitter, only a subset of the transmission coils may be used. Typically, the wireless-charger transmitter uses multiplexor (MUX) switches (which are sometimes referred to as 'coil-selection MUX switches') to select the transmission coil or coils that are driven by a power driver at a given switching cycle. Notably, the subset of the transmission coils that are active may be connected or electrically coupled by a printed-circuit-board traces and/or the MUX switches (and, more generally, by a low-impedance path) to a surrounding network, which may include capacitor(s) and half or full-bridge power driver(s). (Note that each active coil may have one associated capacitor and an associated half or full-bridge driver. In FIGS. 1 and 2, which present a circuit diagram and a circuit model of existing wireless-charger transmitters, there is a single capacitor, because only one coil is active at a given time.) Moreover, the remaining transmission coils may be disabled. For example, the disabled transmission coils may be open circuits, so little or no current flows through them.

Furthermore, a single field-effect transistor (FET) is usually insufficient to implement a MUX switch because the FET may only be able to block current in one direction due to the parasitic body diode. Notably, for an NFET, there may effectively be a body diode in parallel with the FET with its forward direction from its source to drain. Consequently, even if the gate is shorted to the source, current may still flow from the source to the drain via the body diode.

Therefore, many existing wireless-charger transmitters implement MUX switches using back-to-back FETs. This is shown in FIG. 1. Notably, in FIG. 1, each of the NMOS MUX switches may include two back-to-back FETs. When the gate is shorted to the source, each of the two back-to-back FETs may be off. Moreover, the two body diodes associated with the two back-to-back FETs may block currents in both directions.

However, the architecture shown in FIG. 1 often has several drawbacks. Notably, because two FETs are used, the cost of the wireless-charger transmitter is increased. Moreover, the two FETs in series may double the drain-to-source on resistance of the MUX switch, which may reduce the system power efficiency.

Additionally, in order to keep both FETs off, the gate voltage may need to follow the source voltage. However, even if a pair of back-to-back FETS are off, there will still be small currents flowing through them. For example, a disabled coil may have a voltage across it because of mutual coupling to the active coil, which may result in a small current. Consequently, because the source voltage is usually not the same as ground, a level-shifter network in many existing wireless-charger transmitters may include floating driving circuits to level shift the ground-referenced control signals to the gate-source-referenced domain in order to control each pair of back-to-back FETs.

These limitations of existing wireless-charger transmitters are illustrated in FIG. 2. In FIG. 2, an existing wireless-charger transmitter includes two transmission coils. V1 models a half-bridge driver outputting a voltage at 128 kHz, with a 50% duty cycle, and with a 25-V peak-to-peak square-wave waveform. Moreover, Lp1 models a transmission coil that is not active and Lp2 models a transmission coil that is active/connected. Note that each pair of back-to-back NFETs (such as M1 and M2 or M3 and M4) represents a MUX switch. Furthermore, V_ctrl_1 and V_ctrl_2 model control voltages in a 5 V domain (e.g., generated from a 5 V general purpose input/output (I/O), and E1 and E2 are voltage-controlled voltage sources having gains of 2. These voltage-controlled voltage sources model the level-shifters and driving networks that turn the MUX switches on and off.

FIG. 3 presents simulated steady-state electrical waveforms in the existing wireless-charger transmitter of FIG. 1. In FIG. 3, note that the current through Lp1 is much smaller than the current through Lp2. Moreover, the gate and source voltages of the MUX switch in the disconnected branch vary by tens of volts from cycle-to-cycle with a frequency of 128 kHz.

SUMMARY

Embodiments of an integrated circuit are described. This integrated circuit includes a wireless-charger transmitter, which includes a driver circuit electrically coupled to multiple branches associated with multiple transmission coils. A given branch includes or electrically couples to: a capacitor, a MUX switch that includes a single FET or a single integrated-gate bipolar transistor (IGBT), and a given transmission coil. Moreover, the wireless-charger transmitter includes a control circuit that provides control signals to gates of FETs or the IGBTs in the branches that selectively activate at least the MUX switch in the given branch and selectively deactivate remaining MUX switches in a remainder of the branches. Furthermore, the driver circuit performs wireless charging by driving the given transmission coil in the activated given branch using an electrical signal having a fundamental frequency component.

Note that one or more of the capacitor, the FET or the IGBT, and/or the given transmission coil may be external components to the integrated circuit.

Moreover, the FET or the IGBT may be included on a second integrated circuit that is separate from the integrated circuit.

Furthermore, the control circuit may dynamically adjust the wireless charging by changing: an amplitude of the electrical signal, and/or the fundamental frequency. Additionally, the wireless-charger transmitter may receive feedback about the wireless charging from an electronic device and the dynamic adjusting may be based at least in part on the feedback. In some embodiments, the feedback may be received via a communication channel that uses physical components in the activated given branch and/or via an out-of-band communication channel.

Note that the FET may, in a nonconductive state, block current flow in the given branch for capacitor voltages having a first polarity, and the capacitor may charge up and bias a body diode of the FET to block current flow in the given branch for capacitor voltages having a second polarity after a predefined number of cycles of the fundamental frequency.

Moreover, the control signals may selectively activate MUX switches in more than one of the branches.

Furthermore, the MUX switch may only include the FET or the IGBT.

Additionally, for a given control signal and a given FET state, a gate-source voltage of the FET may be approximately constant as a function of time.

In some embodiments, the fundamental frequency may be approximately a resonance frequency corresponding to a capacitance of the capacitor and an inductance of the given transmission coil.

Another embodiment provides an electronic device that includes the integrated circuit.

Another embodiment provides a system that includes the integrated circuit.

Another embodiment provides a method for performing wireless charging. This method includes at least some of the operations performed by the wireless-charger transmitter.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit is described. This integrated circuit may include a wireless-charger transmitter, which includes a driver circuit electrically coupled to multiple branches associated with multiple transmission coils. A given branch may include or may be electrically coupled to: a capacitor, a multiplexor (MUX) switch that includes a single field-effect transistor (FET) or a single integrated-gate bipolar transistor (IGBT), and a given transmission coil. In some embodiments, the MUX switch may only include the FET or the IGBT. Moreover, the wireless-charger transmitter may include a control circuit that provides control signals to gates of FETs or the IGBTs in the branches that selectively activate at least the MUX switch in the given branch and selectively deactivate remaining MUX switches in a remainder of the branches. Furthermore, the driver circuit may perform wireless charging by driving the given transmission coil in the activated given branch using an electrical signal having a fundamental frequency component.

By using the single FET or the single IGBT in the given MUX switch, the disclosed circuit techniques may eliminate one of FETs in existing wireless-charger transmitters. This may reduce the complexity, the die area and the cost of the wireless-charger transmitter, and may improve the system power efficiency. In addition, the disclosed circuit techniques may also eliminate a need for a level-shifter network in the wireless-charger transmitter, which is used in existing wireless-charger transmitters to shift control signals. Consequently, the circuit techniques may facilitate the use of USB 2.0 in use of the wireless-charger transmitter in a wide variety of systems, electronic devices and applications.

We now describe embodiments of the circuit techniques. These circuit techniques may be performed using one or more integrated circuits are described. The one or more integrated circuits may include some or all of the components and associated functionality of a wireless-charger transmitter with multiple transmission coils. Moreover, during operation, the one or more integrated circuits may select at least a subset of the transmission coils using MUX switches. A given MUX switch may include one FET, instead of the two back-to-back FETs used in many existing wireless-charger transmitters.

Figure 1:
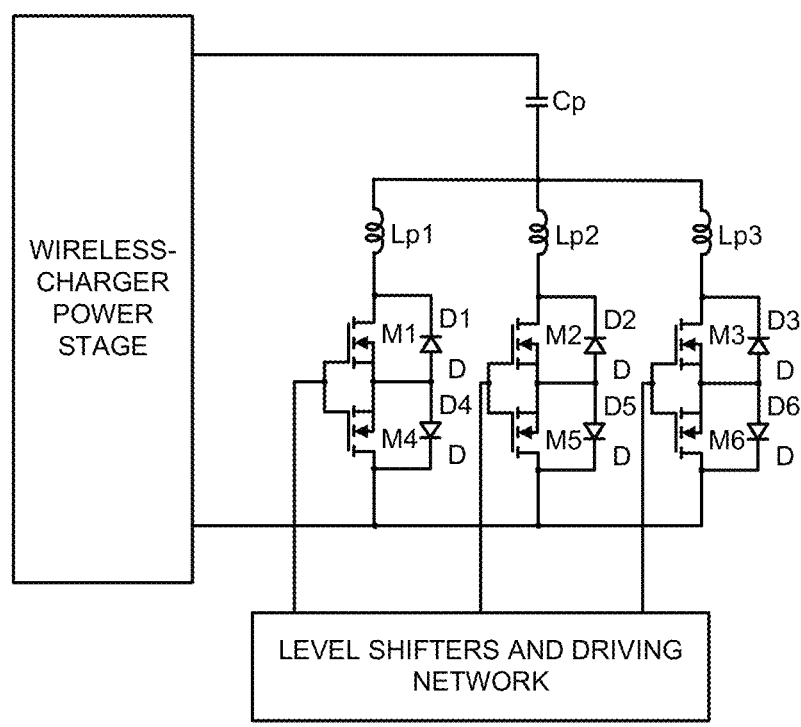
FIG. 1 is a block diagram illustrating a circuit diagram of an existing wireless-charger transmitter.
Figure 2:
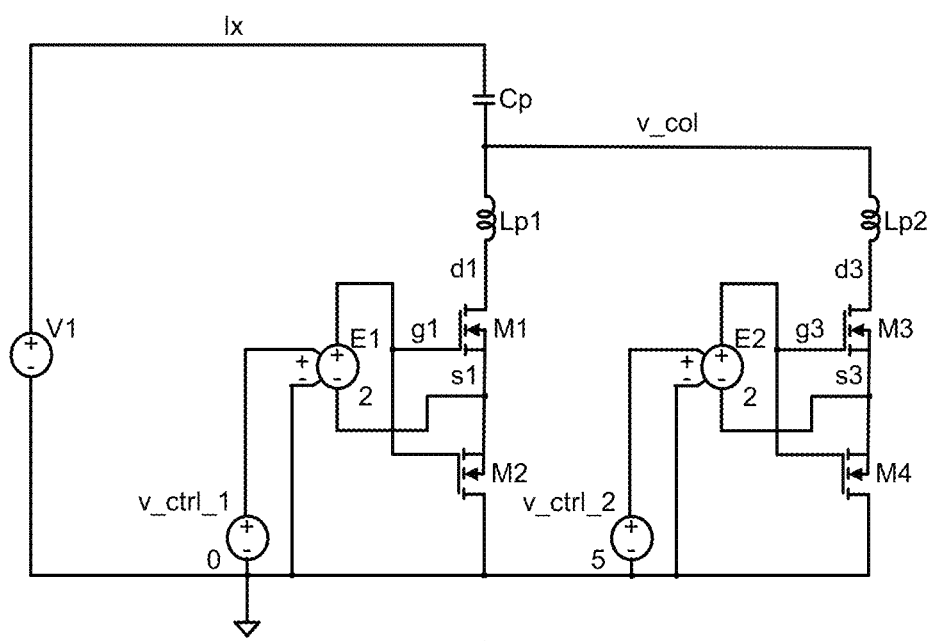
FIG. 2 is a block diagram illustrating a circuit model of an existing wireless-charger transmitter.
Figure 3:
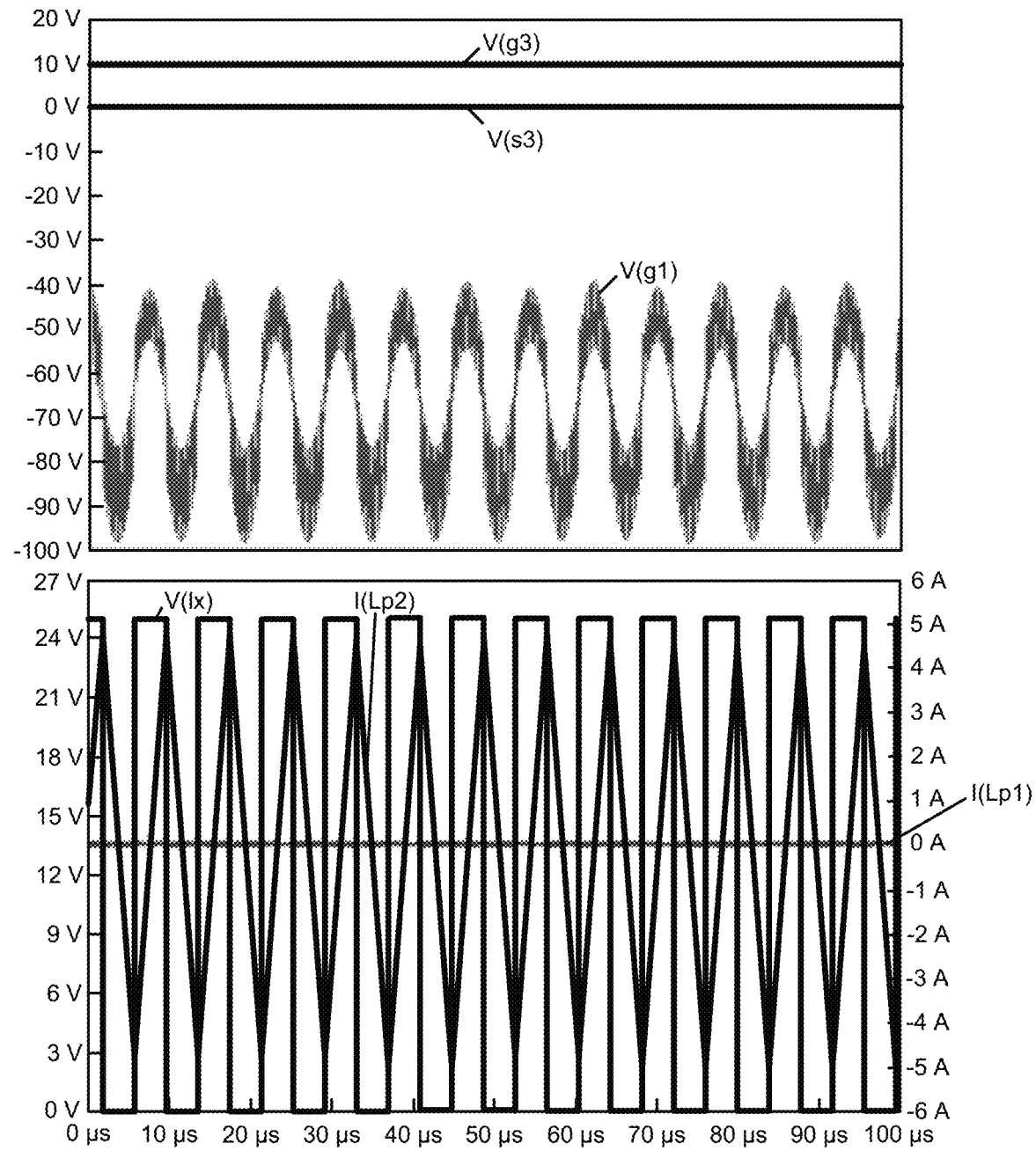
FIG. 3 is a drawing illustrating simulated steady-state electrical waveforms in the existing wireless-charger transmitter of FIG. 1.
Figure 4:
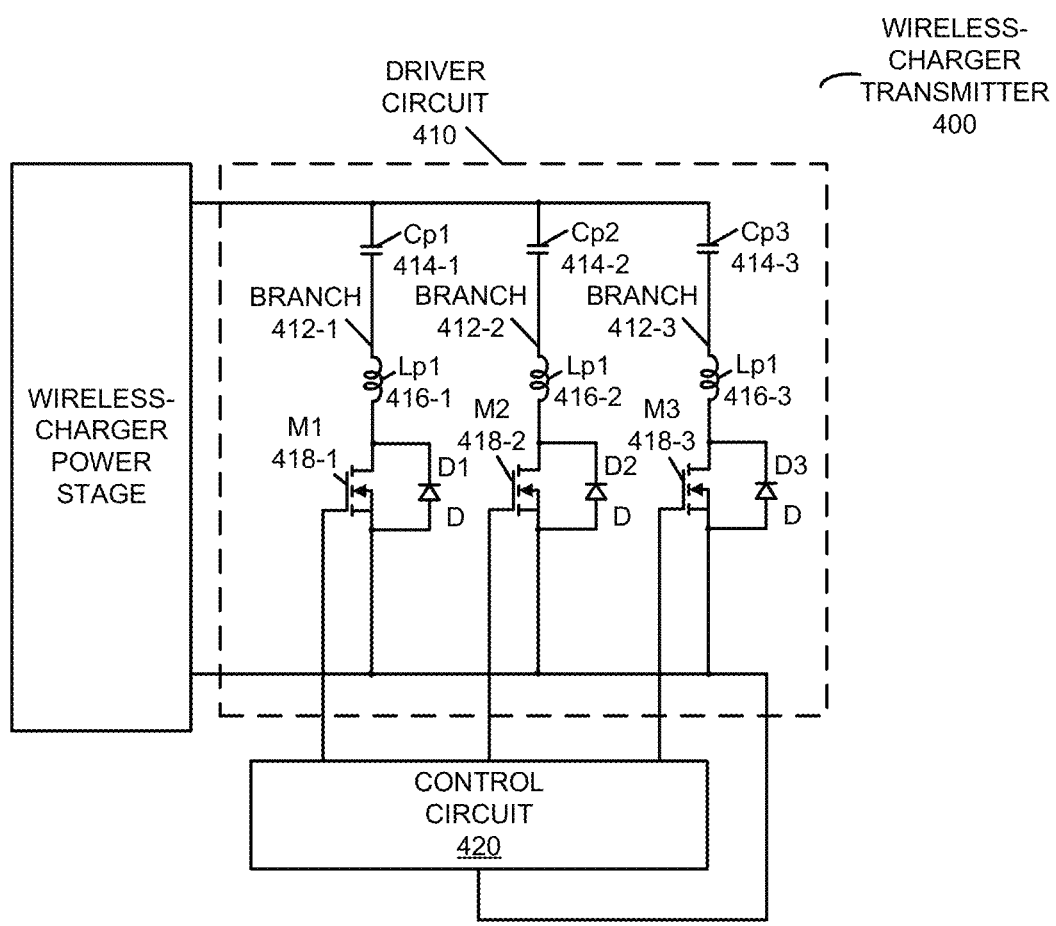
FIG. 4 is a block diagram illustrating an example of a wireless-charger transmitter according to some embodiments of the present disclosure.

Furthermore, the circuit techniques may provide a solution for a wireless-charger transmitter, which may be implemented on or off-chip. This wireless-charger transmitter may include fewer active components and, thus, may be less complicated, may have a reduced cost, may use less die area (if integrated on chip), and may have an improved system power efficiency. Notably, the wireless-charger transmitter may use one FET (or an integrated-gate bipolar transistor) to implement a MUX switch. This is shown in FIG. 4, which presents a block diagram of an example of a wireless-charger transmitter 400. Note that wireless-charger transmitter 400 includes a driver circuit 410 with a capacitor (such as capacitor 414-1) in each of branches 412 that drive different transmission coils 416 (instead of a second FET). Additionally, each of branches 412 may include one FET (such as FET 418-1), which may be a MUX switch (as indicated by M1, M2 or M3) that turns off current flow in one direction (such as for a positive voltage) based at least in part on control signals provided by control circuit 420. (Notably, the control signals from control circuit 420 may be applied to gates of FETs 418 in branches 412 that selectively activate at least the MUX switch in the given branch and selectively deactivate remaining MUX switches in at least some of or a remainder of branches 412.) While the parasitic body diode cannot block current flow in the other direction (such as for a negative voltage), when capacitor 414-1 is charged (e.g., after a few switching cycles) it will keep the parasitic body diode reversed biased (so it will not turn on) and the current will stop flowing. Moreover, as described further below, wireless-charger transmitter 400 may simplify or eliminate a level-shifter network (e.g., in control circuit 420, which, as discussed previously, may be used to shift control signals in wireless-charger transmitters) because the source of FET 418-1 is at ground.

In some embodiments, a given inductance (such as Lp1, Lp2 or Lp3) of a given transmission coil (such as transmission coil 416-1) may be 12 µH, and a given capacitance (such as Cp1, Cp2 or Cp3) of a given capacitor (such as capacitor 414-1) may be 200 nF. Note that the given transmission coil may be fabricated using magnetic wire or a litz coil (such as braided magnetic wire). Moreover, wireless-charger transmitter 400 may have a power consumption of 15 W.

Figure 5:
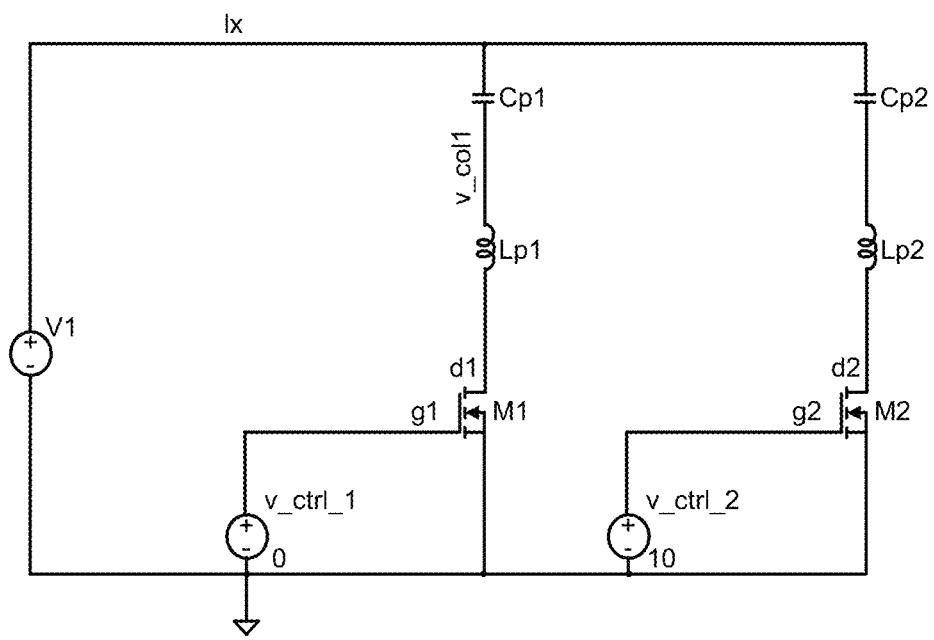
FIG. 5 is a block diagram illustrating an example of a circuit model of the wireless-charger transmitter of FIG. 4 according to some embodiments of the present disclosure.
Figure 6:
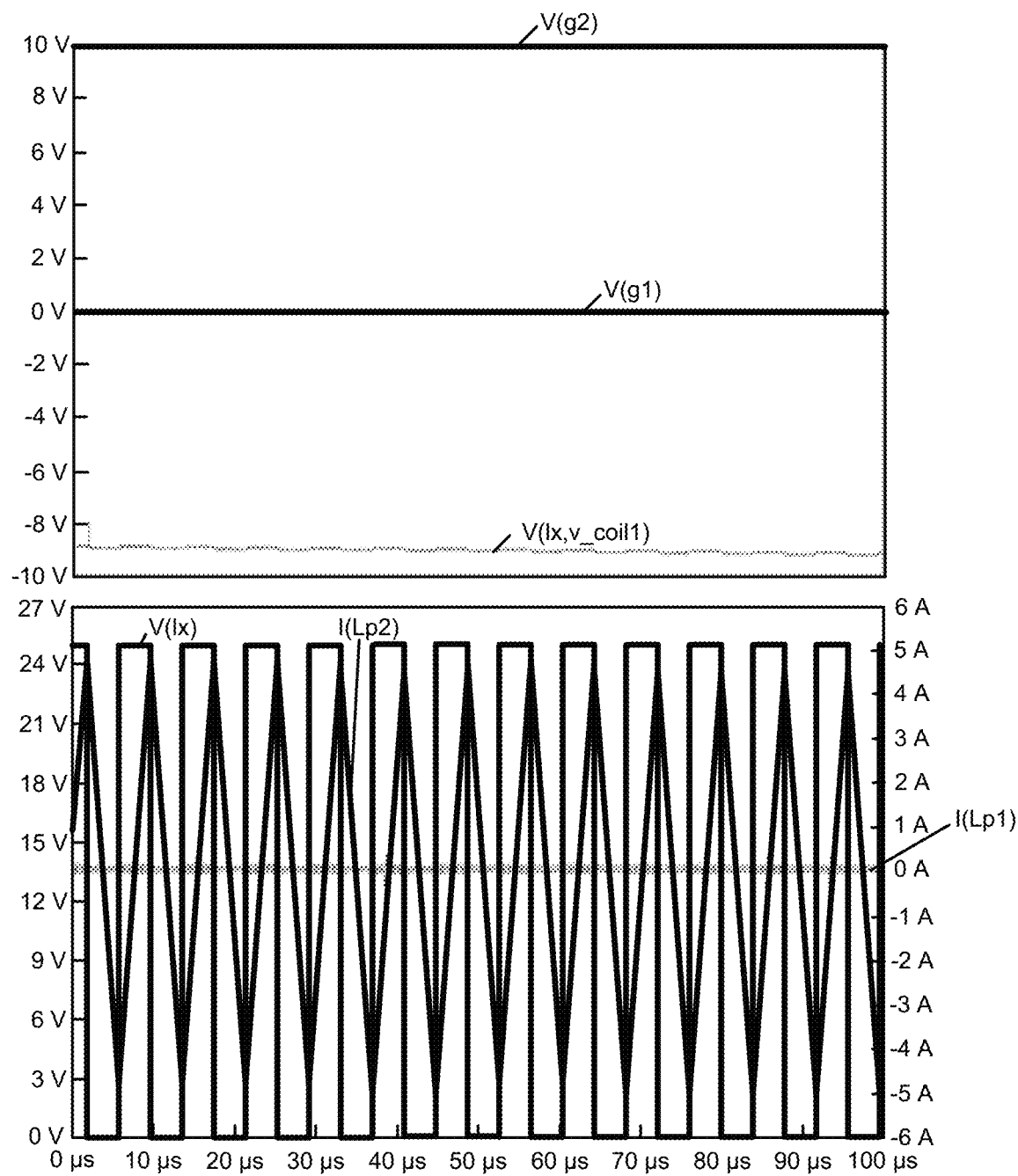
FIG. 6 is a drawing illustrating simulated steady-state electrical waveforms in the wireless-charger transmitter of FIG. 4 according to some embodiments of the present disclosure.

FIG. 5 presents an example of a circuit model 500 of wireless-charger transmitter 400 (FIG. 4). In FIG. 5, M1 is off and M2 is on. Note that Lp2, Cp2 and M2 may form the connected branch. Moreover, although the body diode of M1 will conduct current initially, the voltage on Cp1 voltage will increase until the body diode of M1 can no longer turn on, effectively blocking current in both directions in steady state. FIG. 6 presents simulated steady-state electrical waveforms in wireless-charger transmitter 400 (FIG. 4).

Figure 7:
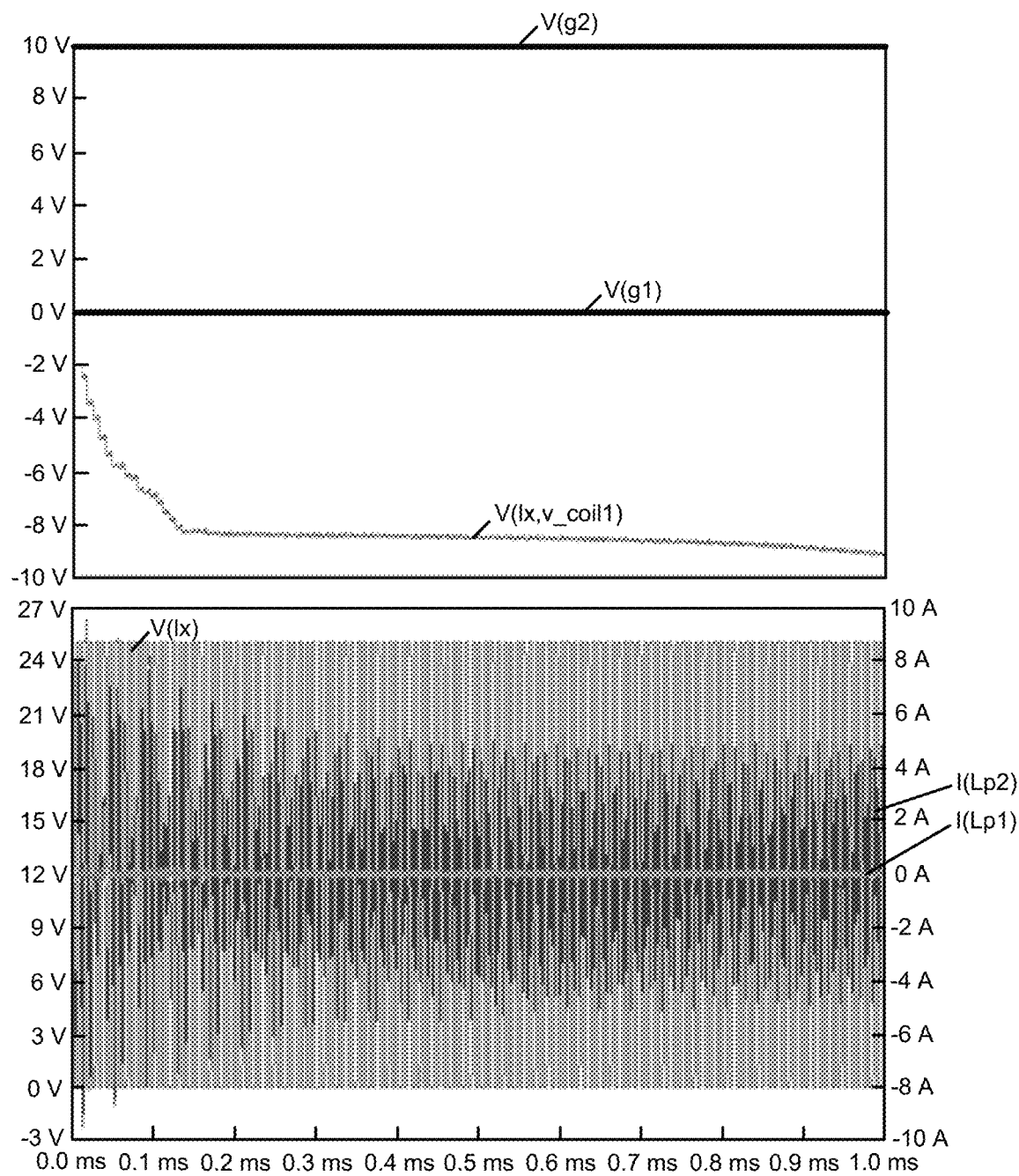
FIG. 7 is a drawing illustrating simulated electrical waveforms of a capacitor in the wireless-charger transmitter of FIG. 4 according to some embodiments of the present disclosure.

As shown in FIG. 6, the current through Lp1 may be much smaller than the current through Lp2. Moreover, the voltages of the control signals of the MUX switches may typically be ground-reference or referred, which may simplify the driving network in wireless-charger transmitter 400 (FIG. 4). Stated differently, the driving network may have a well-controlled source voltage (such as a gate-source voltage of 5-10 V), which may simplify or eliminate a level-shifter network. Furthermore, in FIG. 6, V(LX, v_coil1) is the voltage across the Cp1 capacitor. It holds a DC voltage. This voltage may be high enough so that the body diode of M1 is always reverse biased. FIG. 7 presents a simulated waveform illustrating the charging of Cp1 in wireless-charger transmitter 400 (FIG. 4). Note that, for a given control signal and a given FET state, a gate-source voltage of the FET may be approximately constant as a function of time.

The disclosed circuit techniques may offer benefits, including using only one FET in each transmission-coil branch and fewer (overall) components for the driver circuit, at the price of an extra capacitor in each transmission-coil branch. On balance, this architecture may reduce the cost of a wireless-charger transmitter. Moreover, for the same type of FET used in existing wireless-charger transmitters, the drain-to-source resistance may be halved. Consequently, the system power efficiency may be increased.

In some embodiments, a unit receiving power (such as an electronic device that is being wirelessly charged) may request more or less power from a wireless-charger transmitter via in-band and/or out-of-band communication. Note that the wireless charging may use resonant charging or non-resonant charging. Thus, the fundamental frequency of the electrical signals that drive the activated given branch in the driver circuit may be approximately a resonance frequency corresponding to a capacitance of the capacitor and an inductance of the given transmission coil. In response to requests for more or less power, the wireless-charger transmitter may have a fixed operating frequency and the driving voltage may be dynamically changed (which may be used, e.g., in automotive wireless charging). Alternatively or additionally, the wireless-charger transmitter may have a variable operating frequency. For example, the driver circuit in the wireless-charger transmitter may perform wireless charging by changing a fundamental frequency component in an electrical signal driving a given transmission coil in an activated given branch in the driver circuit. Note that a wireless coupling factor between the wireless-charger transmitter and a unit receiving power may be changed.

Figure 8:
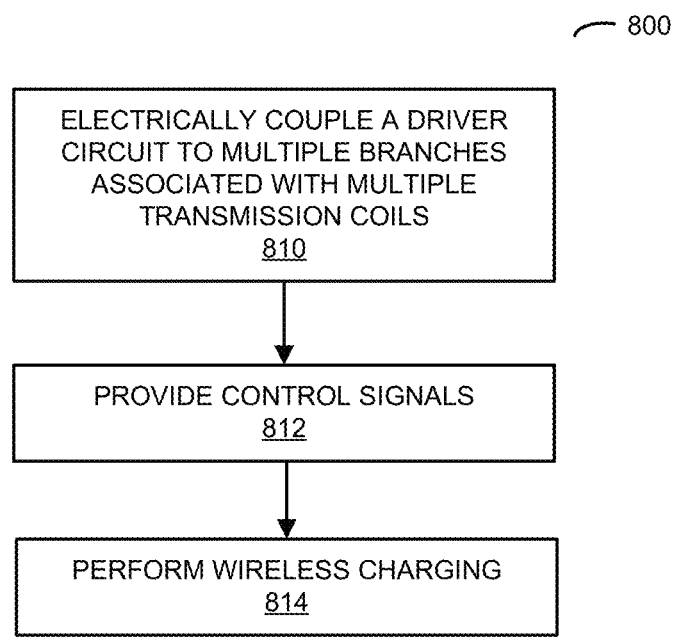
FIG. 8 is a flow diagram illustrating an example of a method for performing wireless charging according to some embodiments of the present disclosure.

We now describe embodiments of a method. FIG. 8 presents a flow diagram illustrating an example of a method 800 for performing wireless charging using a wireless-charger transmitter, such as wireless-charger transmitter 400 (FIG. 4). During operation, the wireless-charger transmitter may electrically coupling a driver circuit to multiple branches associated with multiple transmission coils (operation 810), where a given branch may include or may be electrically coupled to: a capacitor, a MUX switch that includes a single FET or a single IGBT, and a given transmission coil. Then, the wireless-charger transmitter may provide, from a control circuit, control signals (operation 812) to gates of FETs or the IGBTs in the branches that selectively activate at least the MUX switch in the given branch and selectively deactivate remaining MUX switches in a remainder of the branches. Next, the wireless-charger transmitter may perform, using the driver circuit, the wireless charging (operation 814) by driving the given transmission coil in the activated given branch using an electrical signal having a fundamental frequency component.

In some embodiments of the method 800, there may be additional or fewer operations. Moreover, the order of the operations may be changed, and/or two or more operations may be combined into a single operation.

For example, the control circuit may dynamically adjust the wireless charging by changing: an amplitude of the electrical signal, and/or the fundamental frequency. Furthermore, the wireless-charger transmitter may receive feedback about the wireless charging from an electronic device and the dynamic adjusting may be based at least in part on the feedback. In some embodiments, the feedback may be received via a communication channel that uses physical components in the activated given branch and/or via an out-of-band communication channel. Additionally, the control signals may selectively activate MUX switches in more than one of the branches.

The disclosed wireless-charger transmitter and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a wireless-charger device, a wireless-charging system, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the wireless-charger transmitter and/or the integrated circuit that includes the wireless-charger transmitter, in alternative embodiments different components and/or subsystems may be present in the wireless-charger transmitter and/or the integrated circuit that includes the wireless-charger transmitter. Thus, the embodiments of the wireless-charger transmitter and/or the integrated circuit that includes the wireless-charger transmitter may include fewer components, additional components, different components, two or more components may be combined into a single component, a single component may be separated into two or more components, one or more positions of one or more components may be changed, and/or there may be different types of components. For example, a given branch in the wireless-charger transmitter may include a single IGBT instead of a single FET. Note that one or more of the capacitor, the FET or the IGBT, and/or the given transmission coil may be external components to the wireless-charger transmitter. In some embodiments, the FET or the IGBT may be included on a second integrated circuit that is separate from an integrated circuit that includes the wireless-charger transmitter. Additionally, in some embodiments, the MUX switch may only include the FET or the IGBT. In some embodiments, the wireless-charger power stage may be an external component to the wireless-charger transmitter.

Moreover, the circuits and components in the embodiments of the wireless-charger transmitter and/or the integrated circuit that includes the wireless-charger transmitter may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising a wireless-charger transmitter, wherein the wireless-charger transmitter comprises:
   a driver circuit electrically coupled to multiple branches associated with multiple transmission coils, wherein a given branch comprises or is configured to electrically couple to: a capacitor, a multiplexer (MUX) switch that comprises a single field-effect transistor (FET) or a single integrated-gate bipolar transistor (IGBT), and a given transmission coil; and
   a control circuit configured to provide control signals to gates of FETs or the IGBTs in the branches that selectively activate at least the MUX switch in the given branch and selectively deactivate remaining MUX switches in a remainder of the branches, wherein the driver circuit is configured to perform wireless charging by driving the given transmission coil in the activated given branch using an electrical signal having a fundamental frequency component, wherein the FET is configured in a nonconductive state to block current flow in the given branch for capacitor voltages having a first polarity, and the capacitor is configured to charge up and bias a body diode of the FET to block current flow in the given branch for capacitor voltages having a second polarity after a predefined number of cycles of the fundamental frequency.

2. The integrated circuit of claim 1, wherein one or more of the capacitor, the FET or the IGBT, or the given transmission coil are external components to the integrated circuit.

3. The integrated circuit of claim 1, wherein the FET or the IGBT is included on a second integrated circuit that is separate from the integrated circuit.

4. The integrated circuit of claim 1, wherein the control circuit is configured to dynamically adjust the wireless charging by changing: an amplitude of the electrical signal, the fundamental frequency, or both.

5. The integrated circuit of claim 4, wherein the wireless-charger transmitter is configured to receive feedback about the wireless charging from an electronic device and the dynamic adjusting is based at least in part on the feedback.

6. The integrated circuit of claim 5, wherein the feedback is received via a communication channel that uses physical components in the activated given branch or via an out-of-band communication channel.

7. The integrated circuit of claim 1, wherein the control signals selectively activate MUX switches in more than one of the branches.

8. The integrated circuit of claim 1, wherein the MUX switch consists of the FET or the IGBT.

9. The integrated circuit of claim 1, wherein, for a given control signal and a given FET state, a gate-source voltage of the FET is approximately constant as a function of time.

10. The integrated circuit of claim 1, wherein the fundamental frequency is approximately a resonance frequency corresponding to a capacitance of the capacitor and an inductance of the given transmission coil.

11. An electronic device, comprising:
an integrated circuit comprising a wireless-charger transmitter, wherein the wireless-charger transmitter comprises:
a driver circuit electrically coupled to multiple branches associated with multiple transmission coils, wherein a given branch comprises or is configured to electrically couple to: a capacitor, a multiplexer (MUX) switch that comprises a single field-effect transistor (FET) or a single integrated-gate bipolar transistor (IGBT), and a given transmission coil; and
a control circuit configured to provide control signals to gates of FETs or the IGBTs in the branches that selectively activate at least the MUX switch in the given branch and selectively deactivate remaining MUX switches in a remainder of the branches, wherein the driver circuit is configured to perform wireless charging by driving the given transmission coil in the activated given branch using an electrical signal having a fundamental frequency component, wherein the FET is configured in a nonconductive state to block current flow in the given branch for capacitor voltages having a first polarity, and the capacitor is configured to charge up and bias a body diode of the FET to block current flow in the given branch for capacitor voltages having a second polarity after a predefined number of cycles of the fundamental frequency.

12. The electronic device of claim 11, wherein one or more of the capacitor, the FET or the IGBT, or the given transmission coil are external components to the integrated circuit.

13. The electronic device of claim 11, wherein the control circuit is configured to dynamically adjust the wireless charging by changing: an amplitude of the electrical signal, the fundamental frequency, or both.

14. The electronic device of claim 13, wherein the wireless-charger transmitter is configured to receive feedback about the wireless charging from a second electronic device and the dynamic adjusting is based at least in part on the feedback.

15. The electronic device of claim 14, wherein the feedback is received via a communication channel that uses physical components in the activated given branch or via an out-of-band communication channel.

16. The electronic device of claim 11, wherein the FET or the IGBT is included on a second integrated circuit that is separate from the integrated circuit.

17. The electronic device of claim 11, wherein the MUX switch consists of the FET or the IGBT.

18. A method for performing wireless charging, comprising:
by a wireless-charger transmitter:
electrically coupling a driver circuit to multiple branches associated with multiple transmission coils, wherein a given branch comprises or is electrically coupled to: a capacitor, a multiplexer (MUX) switch that comprises a single field-effect transistor (FET) or a single integrated-gate bipolar transistor (IGBT), and a given transmission coil;
providing, from a control circuit, control signals to gates of FETs or the IGBTs in the branches that selectively activate at least the MUX switch in the given branch and selectively deactivate remaining MUX switches in a remainder of the branches; and
performing, using the driver circuit, the wireless charging by driving the given transmission coil in the activated given branch using an electrical signal having a fundamental frequency component, wherein the FET is in a nonconductive state to block current flow in the given branch for capacitor voltages having a first polarity, and the capacitor charges up and biases a body diode of the FET to block current flow in the given branch for capacitor voltages having a second polarity after a predefined number of cycles of the fundamental frequency.

19. The method of claim 18, wherein the method comprises receiving feedback about the wireless charging from an electronic device and the dynamic adjusting is based at least in part on the feedback.

20. The method of claim 18, wherein the fundamental frequency is approximately a resonance frequency corresponding to a capacitance of the capacitor and an inductance of the given transmission coil.

* * * * *